United States Patent [19]

Shoemaker

[11] Patent Number: 5,010,385
[45] Date of Patent: Apr. 23, 1991

[54] RESISTIVE ELEMENT USING DEPLETION-MODE MOSFET'S

[75] Inventor: Patrick A. Shoemaker, Lemon Grove, Calif.

[73] Assignee: The United States of America as represented by the Secretary of the Navy, Washington, D.C.

[21] Appl. No.: 502,701

[22] Filed: Mar. 30, 1990

[51] Int. Cl.$^5$ .................................. H01L 27/02
[52] U.S. Cl. ........................ 357/41; 307/269; 307/304; 307/475
[58] Field of Search ............... 357/41; 307/269.1, 304, 307/475

[56] References Cited

U.S. PATENT DOCUMENTS

| | | | |
|---|---|---|---|
| 4,001,612 | 1/1977 | Aoki et al. ............................ | 357/51 |
| 4,152,716 | 5/1979 | Torii et al. ........................... | 357/41 |
| 4,173,734 | 11/1979 | Hirasawa et al. ..................... | 357/42 |
| 4,318,040 | 3/1982 | Hilbourne ............................. | 307/304 |
| 4,667,216 | 5/1987 | Bigall et al. .......................... | 357/41 |
| 4,810,907 | 3/1989 | Tohyama .............................. | 307/475 |
| 4,833,342 | 5/1989 | Kiryu et al. .......................... | 307/296.1 |

Primary Examiner—Jerome Jackson, Jr.
Assistant Examiner—Dang Xuan Hung
Attorney, Agent, or Firm—Harvey Fendelman; Thomas Glenn Keough

[57] ABSTRACT

The present invention provides a linear resistance element comprising a pair of transistors. The transistor pair includes first and second depletion-type field effect transistors each having a gate, a source electrode, a drain electrode, a channel mobility, and a threshold voltage. The source and drain electrodes of each transistor define a source-drain current path through a channel. The first and second transistors are connected with their source-drain paths in series with each other. The gates of the first and second transistors are connected in common to the series connection between the source-drain current paths. The channel width-to-length ratio, channel mobility, and threshold voltage of the first transistor are substantially equal to the corresponding properties of the second transistor. Any number of transistor pairs may be serially connected together.

12 Claims, 2 Drawing Sheets

5,010,385

RESISTIVE ELEMENT USING DEPLETION-MODE MOSFET'S

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to a linear resistance element suitable for use in integrated circuits, particularly integrated circuits that require a large linear resistance independent of voltage potential applied across the resistive element.

Long lines of heavily-doped polysilicon have been used to form resistors in integrated circuits. However, the relatively low resistivity of this material limits the values of resistance which can be obtained. Lightly-doped regions of silicon, such as p-well diffusions or implants, have been used to form resistors with higher values. However, these resistances are not particularly accurate or reproducible and are susceptible to fixed charge or states, as for example at interfaces, which can affect their linearity and resistance values. Depletion-mode transistors have been used as resistive loads but their current-voltage relationships are significantly non-linear. Large, linear resistances are usually regarded as impractical in IC technology.

U.S. Pat. No. 4,001,612 discloses a linear resistance element for LSI circuitry. The circuit of this invention is composed of two similar depletion type, field effect transistors having their source electrodes connected together and to a voltage source. Their drain electrodes are similarly connected together and to the other side of the voltage source. The gates of the two FET's are connected one to the common drain electrode and the other to the common source electrode. The resistance of this FET pair is substantially independent of the circuit current or voltage. A limitation of this linear resistance element is that the channels of the two FET's are connected in parallel which results in a linear resistance element having less resistance than would otherwise be provided by resistive elements connected in series within the same area.

U.S. Pat. No. 4,667,216 discloses an electric resistor consisting of at least two simultaneously produced monolithically combined MIS field-effect transistors for integrated circuits. Each transistor has a source electrode and a drain electrode that define a source-drain path, a gate terminal, and a channel width to channel length ratio. The transistors are connected in series with each other through the source-drain paths. The gate terminals of each transistor are connected to one of the source and drain electrodes. The gates of each transistor forming a pair are connected together and to the source and drain electrodes that connect each transistor. The channel width to channel length ratios of each transistor comprising a transistor pair are different. This configuration provides a two terminal resistor such that the transistors are graded and balanced against each other with respect to the channel width to channel length ratios. In the operation of this resistor, a given fixed potential $V_M$ is applied to one of the resistor terminals. A first voltage $(V_1 - V_M)$ and a second voltage $(V_m - V_2)$ are alternately applicable to the other terminal wherein $(V_1 - V_M) = -(V_M - V_2)$. Equal and oppositely directed current flows through the resistor when the first voltage is applied as compared to when the second voltage is applied. However, because one of the 11 terminals must be at a fixed potential, this device is unsuitable for applications requiring linearity independent of potential.

Thus, there is a need for a linear resistor suitable for application in integrated circuits which functions independently of potential and which provides greater resistance for a given number of transistors having a particular geometry than is available using present linear resistance elements.

SUMMARY OF THE INVENTION

The present invention is a linear resistance element suitable for use in integrated circuits that provides a resistance which is substantially independent of the voltages applied to the terminals of the element over a certain operating range. The invention also provides a greater resistance for a given number of transistors having a particular geometry than is available using present linear resistance elements.

The present invention provides a linear resistance element comprising a pair effect transistors. The transistor pair includes first and second depletion-type field effect transistors each having a gate, a source electrode, a drain electrode, a channel mobility, and a threshold voltage. The source and drain electrodes of each transistor define a source-drain current path through a channel. The first and second transistors are connected with their source-drain paths in series with each other. The gates of the first and second transistors are connected in common to the series connection between the source-drain current paths. The channel width-to-length ratio, channel mobility, and threshold voltage of the first transistor are substantially equal to the corresponding properties of the second transistor. Any number of transistor pairs may be serially connected together.

DESCRIPTION OF THE PREFERRED EMBODIMENT

Figure 1:
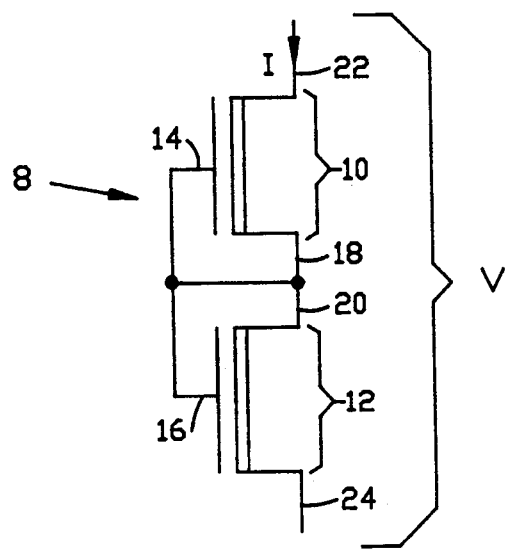
FIG. 1 illustrates a schematic diagram of a resistive element using depletion-mode MOSFET's.

The present invention, shown in FIG. 1, is linear resistance element 8 composed of two MOS series connected, depletion-type, field effect transistors 10 and 12 having gates 14 and 16, respectively. The source and drain terminals of each of transistors 12 and 14 provide a source-drain path through the channel region of each transistor. Current carrying terminals 18 and 20 of transistors 10 and 12, respectively, are operably connected in common with gates 14 and 16. Terminals 22 and 24 provide external access to resistance element 8. Depending on the direction of current flow, the source terminal of either transistor 10 or 12 and drain terminal of the other transistor are connected to commonly connected gates 14 and 16. Transistors 10 and 12 may both be either n- or p-channel type field effect transistors.

Figure 2:
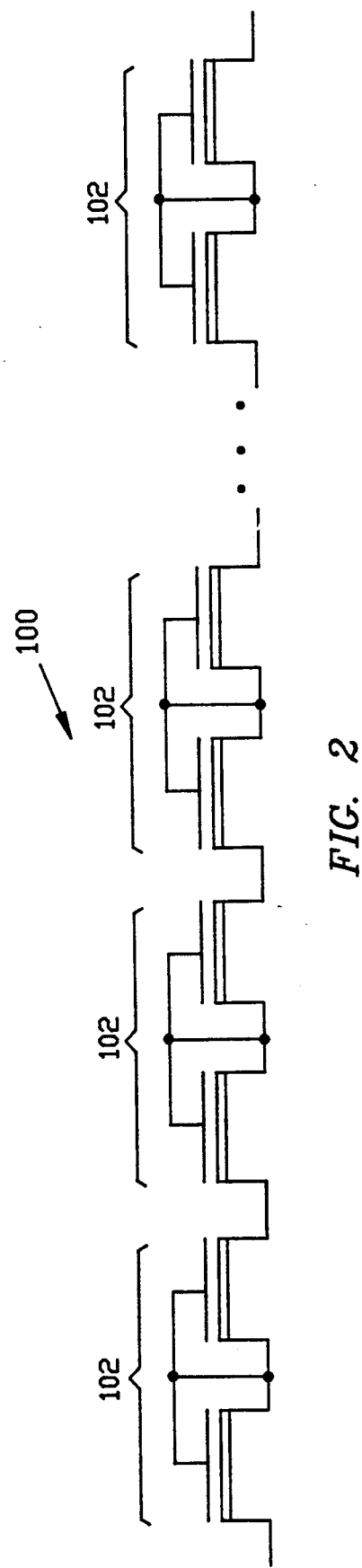
FIG. 2 illustrates a series of serially connected linear resistive elements where each element includes a pair of depletion-mode MOSFET's.

Furthermore, as shown in FIG. 2, a linear resistance element 100 may be constructed of a series of serially connected transistor pairs 102, where each pair 102 consists of transistors having the characteristics of transistors 10 and 12. In the operation of linear resistance element 8, assume that the devices are operated in the linear or triode region so that the drain current $I_d$ of each transistor 12 and 14 is given to first order by:

$$I_d = K [(V_{gs} - V_T) V_{ds} - \tfrac{1}{2} V_{ds}^2], \tag{1}$$

where the subscripts d, g, and s indicate drain, gate, and source, respectively, $V_T$ is the threshold voltage, and $K = \mu\, C_{ox} W/L$, where $\mu$ is the channel mobility, $C_{ox}$ is the capacitance per unit area of the gate oxide, and W/L is the width-to-length ratio of the channel of the transistor. It is assumed that the parameters $V_T$, $\mu$, and the channel width-to-length ratios are substantially equal for transistors 12 and 14. Therefore, the constant K is also substantially equal for each of transistors 12 and 14. Equation (1) governing transistors 12 and 14 in linear resistance element 8 may be solved for the common gate voltage under DC conditions and the result back-substituted to obtain the DC current-voltage relationship for the circuit illustrated in FIG. 1:

$$I = \tfrac{1}{2} K\, V_T V [1 - [V/(2V_T)]^2]^{\tfrac{1}{2}}, \tag{2}$$

where V is the voltage drop across linear resistance element 8 and I is the current flowing through this element. Equation 2 is 14 valid while both transistors are operated in the linear region. Saturation of one of the devices occurs when the magnitude of V reaches the value $V_{sat}$ given by:

$$V_{sat} = 2^{\tfrac{1}{2}} |V_T| \tag{3}$$

The conductance, $G_o = dI/dV$ at zero voltage is $\tfrac{1}{2} K V_T$. At $V = V_T$, the predicted deviation from the linear relation $I = G_o V$ is approximately thirteen percent, while at $V = \tfrac{1}{2} V_T$, I is only three percent. In practice, the linearity of the circuit is influenced by second-order effects as well, such as the body effect which arises due to substrate-to-source bias in bulk silicon. This effect may be minimized by restricting the range of voltages applied to terminals 22 and 24 of linear resistance element 8, which in any case must remain within the supply voltages in a bulk silicon implementation.

The gate capacitance of the transistors results in an imaginary component of the impedance which becomes significant at a frequency dependent upon the geometries and electrical parameters of the transistors. We linearize the circuit for a small-signal analysis about the operating bias V, allowing $R_1$ to represent the incremental resistance of the transistor whose source is connected to the gates, $C_1$ to represent its incremental gate-to-drain capacitance, and allowing $R_2$ and $C_2$ to represent, respectively, the resistance and gate-to-source capacitance of the device whose drain is connected to the gates. The impedance, Z, of the circuit becomes:

$$Z = R_s (1 + \tau_p s) / [(1 + \tau_1 s)(1 + \tau_2 s)] \tag{4}$$

where s is the complex frequency parameter, $R_s = R_1 + R_2$, $\tau_1 = R_1 C_1$, $\tau_2 = R_2 C_2$, and $\tau_p = (C_1 + C_2) R_1 R_2 / (R_1 + R_2)$. About $V = 0$, $R_1 = R_2 = \tfrac{1}{2} R_s$, the capacitances are evenly divided between the sources and drains, and $\tau_p = \tau_1 = \tau_2 = \tau$, where:

$$W L\, C_{ox}/(2 K V_T) = L^2/(2 \mu V_T). \tag{6}$$

Using a simple estimate of the gate-to-drain and gate-to-source capacitances in the triode region:

$$C_{gd} = \tfrac{2}{3} W L\, C_{ox}[1 - (1-X)^2/(2-X)^2] \tag{5}$$

$$C_{gs} = \tfrac{2}{3} W L\, C_{ox} [1 - 1/(2-X)^2],$$

where $X = V_{ds}/(V_{gs} - V_T)$, and evaluating the incremental resistances, we obtain approximate values for the time constants at non-zero biases; about $V = V_T$, $\tau_p = \tau$, $\tau_1 = 1.7$, and $\tau_2 = 0.8$, while about $V = \tfrac{1}{2} V_T$, $\tau_p = \tau$, $\tau_1 = \tfrac{1}{2}\tau$, and $\tau_2 = 0.9\tau$.

We have fabricated this circuit in a thin film silicon-on-sapphire material, using both n- and p-channel depletion-mode transistors. With this material and process, the devices are isolated on the dielectric substrate, eliminating the body effect and its accompanying nonlinearity. This material also permits voltages at terminals 22 and 24 to assume values in any range, even outside the supply voltages, so long as the voltage drop across the resistor is limited to prevent saturation per Equation 3.

The results presented herein are for one particular example of an embodiment of the present invention using an n-channel version of the circuit. The film and gate oxide are both 100 nm thick. Channels were implanted with $10^{12}$ arsenic atoms/cm$^2$. Channel W/L ratios are 3 $\mu$m/15 $\mu$m for each device. Threshold voltages, estimated using data obtained from individual transistors, are bout $-7.75$ V. This value, along with an estimate of the mobility from the same data, gives a predicted resistance of 204 K$\Omega$ at $V = 0$, and a time constant, $\tau$, of 800 ps, corresponding to a frequency of 200 MHz.

Figure 3:
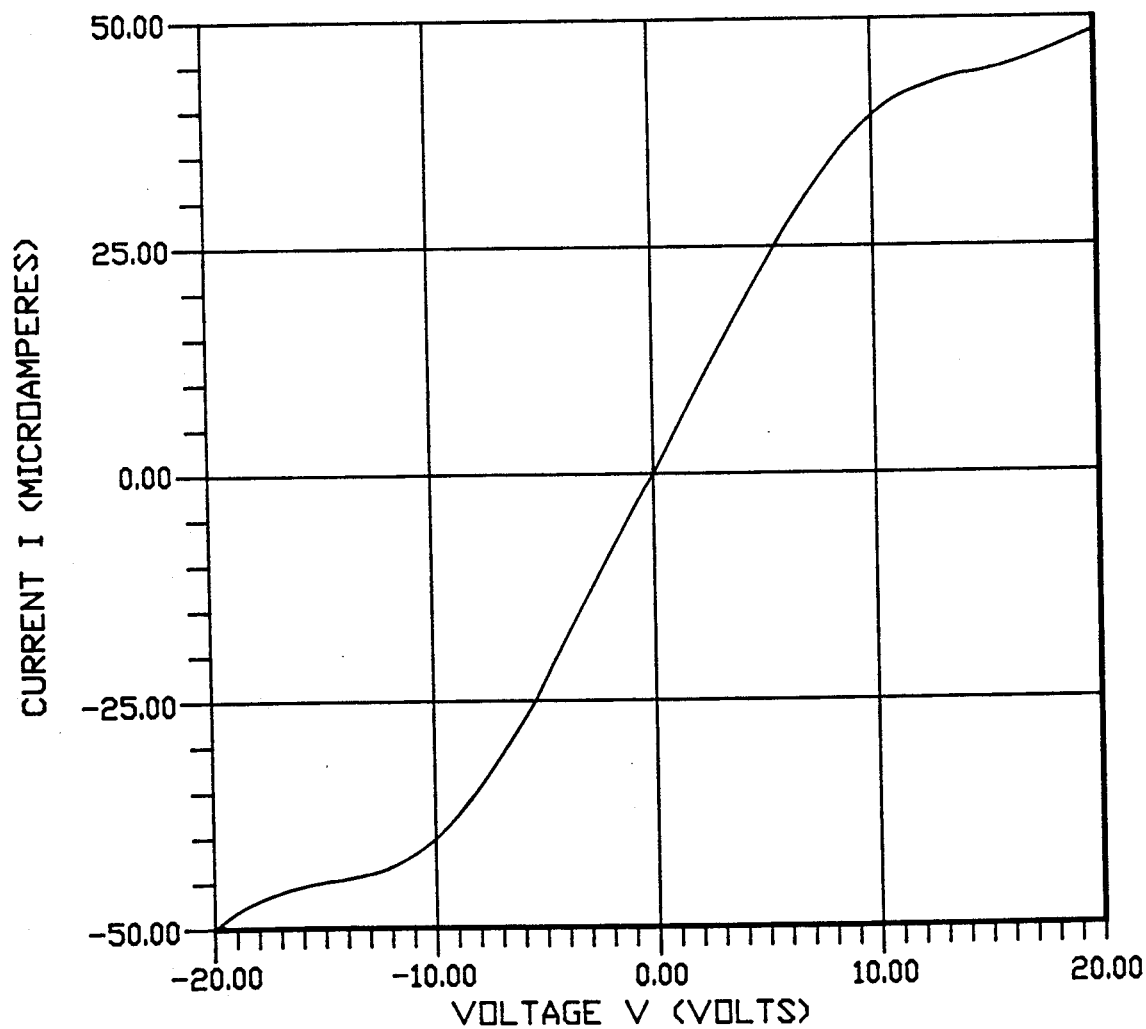
FIG. 3 is a graph which illustrates measured DC current-voltage characteristics of an n-channel version of the circuit in FIG. 1.

FIG. 3 depicts the results of I-V measurements performed on this embodiment. The resistance of $V = 0$ is 212 k$\Omega$, obtained by linear regression using the four data points nearest the origin, at $V = \pm 0.25$ V and $\pm 0.5$ V. This corresponds to an effective "sheet resistance" of about 21 k$\Omega$ per square of channel region. The deviation from the linear relationship predicted by this resistance is measured at six percent when $V = 7.75$ V, the magnitude of the threshold voltage; it is less than the expected deviation due to second-order effects. Nonlinearity becomes more significant as V approaches $V_{sat}$, which is around 11V.

Obviously, many modifications and variations of the present invention are possible in light of the above teachings. Therefore it is to be understood that within the scope of the appended claims the invention may be practiced otherwise than as specifically described.

What is claimed is:

1. A linear resistance element, comprising:
    a first depletion-type field effect transistor having a gate, a source electrode, a drain electrode, a first channel width-to-length ratio, a first channel mobility, and a first threshold voltage, said source and drain electrodes defining a first source-drain current path; and
    a second depletion-type field effect transistor having a gate, a source electrode, a drain electrode, a second channel width-to-length ratio, a second channel mobility, and a second threshold voltage, said source and drain electrodes defining a second source-drain current path; wherein said first and second source-drain current paths are connected in series with each other at a node, said gates of said first and second transistors are connected in common with said node, said first and second channel width-to-length ratios are substantially equal, said first and second channel mobilities are substantially equal, and said first and second threshold voltages are substantially equal.

2. The linear resistance element of claim 1 wherein:
said first and second transistors are p-channel transistors.

3. The linear resistance element of claim 1 wherein:
said first and second transistors are n-channel transistors.

4. A linear resistance element, comprising:
a series of serially connected pairs of transistors, each transistor pair including:
a first depletion-type field effect transistor having a gate, a source electrode, a drain electrode, a first channel width-to-length ratio, a first channel mobility, and a first threshold voltage, said source and drain electrodes defining a first source-drain current path; and
a second depletion-type field effect transistor having a gate, a source electrode, a drain electrode, a second channel width-to-length ratio, a second channel mobility, and a second threshold voltage, said source and drain electrodes defining a second source-drain current path; wherein
said first and second source-drain current paths are connected in series with each other at a node, said gates of said first and second transistors are connected in common with said node, said first and second channel width-to-length ratios are substantially equal, said first and second channel mobilities are substantially equal, and said first and second threshold voltages are substantially equal.

5. The linear resistance element of claim 4 wherein:
said first and second transistors are p-channel transistors.

6. The linear resistance element of claim 4 wherein:
said first and second transistors are n-channel transistors.

7. A linear resistance element, comprising:
a first depletion-type field effect transistor having a gate, a source electrode, a drain electrode, a first channel width-to-length ratio, a first channel mobility, and a first threshold voltage, said source and drain electrodes defining a first source-drain current path, said first transistor formed in a silicon film on an insulating substrate; and
a second depletion-type field effect transistor having a gate, a source electrode, a drain electrode, a second channel width-to-length ratio, a second channel mobility, and a second threshold voltage; said source and drain electrodes defining a second source-drain current path, said second transistor formed in said silicon film on said insulating substrate; wherein
said first and second source-drain current paths are connected in series with each other at a node, said gates of said first and second transistors are connected in common with said node, said first and second channel width-to-length ratios are substantially equal, said first and second channel mobilities are substantially equal, and said first and second threshold voltages are substantially equal.

8. The linear resistance element of claim 7 wherein:
said first and second transistors comprise a transistor pair having first and second terminals, said transistor pair having a voltage difference across said first and second terminals, where said voltage is equal to or less than $2^{\frac{1}{2}}|V_T|$, and $V_T$ is said threshold voltage of said first and second transistors.

9. The linear resistance element of claim 8 wherein:
said first and second transistors are p-channel transistors.

10. The linear resistance element of claim 9 wherein:
said insulating substrate is saphire.

11. The linear resistance element of claim 8 wherein:
said first and second transistors are n-channel transistors.

12. The linear resistance element of claim 11 wherein:
said insulating substate is saphire.

* * * * *